US006197694B1

(12) United States Patent
Beinglass

(10) Patent No.: US 6,197,694 B1
(45) Date of Patent: *Mar. 6, 2001

(54) IN SITU METHOD FOR CLEANING SILICON SURFACE AND FORMING LAYER THEREON IN SAME CHAMBER

(75) Inventor: Israel Beinglass, Sunnyvale, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/690,604

(22) Filed: Jul. 31, 1996

Related U.S. Application Data

(63) Continuation of application No. 08/168,110, filed on Dec. 14, 1993, now abandoned, and a continuation of application No. 07/821,447, filed on Jan. 16, 1992, now Pat. No. 5,532,636.

(51) Int. Cl.[7] .................................................. H01L 21/311
(52) U.S. Cl. ............................ 438/694; 438/764; 134/1.3
(58) Field of Search .................................... 437/225, 228, 437/235, 233, 239; 134/1.3; 438/694, 764, 770, 771, 906, 913, 778, 758, 488

(56) References Cited

U.S. PATENT DOCUMENTS

| | | | |
|---|---|---|---|
| 3,903,325 | * | 9/1975 | Horiuchi ............................... 117/201 |
| 4,149,905 | * | 4/1979 | Levinstein et al. .................... 148/1.5 |
| 4,214,919 | * | 7/1980 | Young ................................... 148/1.5 |
| 4,353,936 | * | 10/1982 | Nozaki et al. ........................ 156/646 |
| 4,533,820 | * | 8/1985 | Shimizu ................................. 219/411 |
| 4,558,660 | * | 12/1985 | Nishizawa et al. .................... 118/725 |
| 4,687,544 | * | 8/1987 | Bersin ................................... 156/643 |
| 4,855,258 | * | 8/1989 | Allman et al. ........................ 437/241 |

(List continued on next page.)

FOREIGN PATENT DOCUMENTS 3-22527 * 1/1991 (JP) ............................... H01L/21/28

OTHER PUBLICATIONS

Wolf, 'S: Proc. for the VLSI Era', Lattice Press, Sunset Beach, Ca (1986).*
Nara et al., 'Photochemical Cleaning and Epitaxy of Si', SPIE vol. 797, Advanced Processing of Semi. Dev. (1987) p. 90.*
Wolf, Silicon Processing for the VLSI Era, vol. 1, 1986, pp. 174, 175, 177, 178, 183–185, and 520.*

(List continued on next page.)

*Primary Examiner*—Charles Bowers
*Assistant Examiner*—Eric D. Kieler
(74) *Attorney, Agent, or Firm*—Blakely Sokoloff Taylor & Zafman

(57) ABSTRACT

A method is described for cleaning a silicon surface of a semiconductor wafer in a vacuum chamber while radiantly heating said silicon surface to maintain it within a first temperature range in the presence of hydrogen gas; then quickly cooling the wafer down to a second temperature range by reducing the radiant heat; and then forming a layer of either polysilicon or oxide over the cleaned surface within this second temperature range without removing the cleaned wafer from the chamber. By cleaning the wafer and then depositing polysilicon or growing oxide over the cleaned silicon surface in the same vacuum chamber, formation of oxides and other contaminants on the cleaned silicon surface between the cleaning step and the deposition or growth step is inhibited, resulting in a higher quality polysilicon or oxide layer formed over the cleaned silicon surface.

19 Claims, 2 Drawing Sheets

U.S. PATENT DOCUMENTS

| | | | |
|---|---|---|---|
| 4,871,416 | * | 10/1989 | Fukuda ................................. 134/1 |
| 5,028,560 | * | 7/1991 | Tsukamoto et al. ................ 437/81 |
| 5,217,559 | * | 6/1993 | Moslshi et al. ..................... 156/345 |
| 5,248,636 | * | 9/1993 | Davis et al. ....................... 437/225 |
| 5,352,636 | * | 10/1994 | Beinglass ........................... 437/235 |
| 5,874,129 | * | 5/1999 | Beinglass et al. .............. 427/248.1 |

OTHER PUBLICATIONS

Wolf, Stanley *Silicon Processing for the VLSI Era,* vol. 1, pp. 166–167, 175–178, 183–185, 516, 517, 520, 1986.*

* cited by examiner

IN SITU METHOD FOR CLEANING SILICON SURFACE AND FORMING LAYER THEREON IN SAME CHAMBER

CROSS-REFERENCE TO RELATED APPLICATIONS

This application is a continuation of U.S. patent application Ser. No. 08/168,110, filed Dec. 14, 1993 now abandoned as a continuation of U.S. patent application Ser. No. 07/821,447, filed Jan. 16, 1992, and now issued as U.S. Pat. No. 5,532,636 on Oct. 4, 1994.

BACKGROUND OF THE INVENTION

1. Field of the Invention

This invention relates to the fabrication of semiconductor devices. More particularly, this invention relates to a method for cleaning a silicon surface to remove native oxides and other contaminants in situ and then forming a layer, such as a layer of polysilicon or a layer of oxide, over the cleaned silicon surface in the same chamber.

2. Description of the Related Art

During the fabrication of semiconductor devices on silicon wafers, various structures are formed on a silicon substrate. The quality of the semiconductor device is a function of the accuracy with which these structures are formed, as well as the cleanliness of the environment in which the semiconductor device is processed. As device geometries become smaller, for example, using submicron design rules, impurities and contaminants exact an unacceptable toll on semiconductor device per wafer yields.

A critical step during the process of fabricating certain semiconductor devices involves depositing a layer of polysilicon on the silicon substrate. In current practice, such deposition is commonly accomplished through use of a low pressure chemical vapor deposition (LPCVD) process. In the LPCVD process, a source of silicon-containing gas, such as, for example, silane or disilane, is provided to a chamber containing one or more silicon wafers having a silicon surface on which a polysilicon layer is to be deposited. The gas mixture flowing into the chamber may also include one or more gases containing dopants such as phosphorus, boron, or arsenic. Examples of such dopant gases include phosphine, arsine, diborine, tertiary butyl phosphine, tertiary butyl arsenic. The silicon wafers are then heated to a deposition temperature, and the gases are fed into the chamber where they are decomposed, thereby depositing a polysilicon layer on the surface of the silicon water.

A common practice is to deposit a polysilicon layer onto a silicon substrate in one or more low pressure chambers as part of a time-consuming sequence of processing steps. In the prior art LPCVD system illustrated in FIG. 1, a chamber 10 received a boat 11 that contains a plurality of silicon wafers 12. A gas fed into chamber 10 from gas source 13 is controlled by a flow controller 14. The gas enters chamber 10 from gas inlet port 15 and flows across wafer 12 in the direction indicated by the arrows in the Figure. A low pressure, i.e. a pressure of about 300 milliTorr, is maintained in chamber 10 by exhaust system 16. Three separately controlled heater elements 17 are included in the system to provide localized temperature variations within chamber 10 that compensate for localized variations in reactant gas concentrations within chamber 10.

Another prior art batch-type LPCVD chamber is illustrated treated in FIG. 2. A plurality of wafers 21 are stacked vertically within the chamber. Reactant gases are injected into the chamber through a plurality of apertures 23 formed in a gas injector 22. Gas injector 22 is conventionally situated between two rows of wafers 21.

Unfortunately, however, the use of such prior art chambers also encourages the growth of native oxides and other contaminants. Native oxides may also be formed on the wafer surface during prior processing steps which expose the wafers to ambient conditions. Some prior art processes include various cleaning steps prior to deposition of polysilicon, or growth of an oxide layer, but the cleaned wafers are usually still exposed to the ambient atmosphere after such cleaning, and native oxides therefore have the opportunity to grow on the wafer surface prior to the polysilicon deposition or oxide growth step.

Handling of multiple wafers, e.g. in a wafer boat, at multiple processing stations during the semiconductor device fabrication process is a particularly acute problem with regard to the formation of native oxides, or the introduction of other impurities to the wafer surfaces. The wafers take significant time to load into the chamber—on the order of thirty minutes,. During the loading step, air is present around and about the wafers and, therefore, a native oxide layer may readily form on the newly cleaned silicon surface of the wafer. This problem is exacerbated by the fact that such native oxide forms in a nonuniform manner, i.e., the first wafer in the chamber may grow a thicker layer of native oxide. This can result in a batch of integrated circuit structures having different electrical properties depending on the particular wafer upon which the integrated circuit structures were formed.

To achieve acceptable semiconductor device yield per silicon wafer in those applications where a polysilicon layer is deposited (or an oxide layer grown) on a silicon surface of the wafer, the silicon surface of the wafer must be absolutely free of contaminants and impurities, such as native oxides, before forming the desired layer thereon. Otherwise, such contaminants and impurities present at the interface between the silicon surface of the wafer and the layer formed thereover may interfere with the electrical properties of the integrated circuit structures therein, resulting, for example, in device noise, degraded performance, or even total failure of the integrated circuit structure.

The formation of native oxide and the presence of various contaminants on the silicon surface of a wafer becomes an increasingly serious problem as device geometries become smaller. Since such native oxides form randomly on the silicon surface of the wafer, control and reproducibility during the semiconductor device fabrication process are degraded.

Native oxides also present a serious problem, for example in bipolar emitter technology, where a very thin (e.g., 20 Angstroms), but uniform, oxide layer is to be grown on the silicon surface of the wafer; as well as inhibiting effective polysilicon deposition. That is, very thin and uniform oxide layers as are required, for example, in submicron semiconductor device structures, cannot be predictably produced when random native oxide is already present on the underlying silicon surface. Rather, an intentionally grown oxide layer over such native oxides will have undesired raised or thick portions at points where native oxides are present on the wafer surface beneath the grown oxide layer. Additionally, such native oxides may include various contaminants. Therefore, the formation of a high quality oxide layer on a silicon surface is degraded when such native oxides are present.

SUMMARY OF THE INVENTION

The present invention is a method for providing a clean interface between a single crystal silicon wafer substrate and a deposited polysilicon layer. A silicon wafer is initially processed under pressure on the order of 5–100 Torr and in the presence of hydrogen as a reactant gas in a single wafer chamber at a temperature in the range of 800° to 950° C. The hydrogen gas supplied to the chamber removes native oxides and other contaminants from the surface of the wafer at this temperature. After removal of native oxide is effected, typically 0.5 to 4.0 minutes of hydrogen gas processing, the temperature is lowered to about 650° C., at which point a polysilicon layer may be deposited on the substrate. The substrate/deposited layer interface thus formed is of exceptional quality and is readily controlled at submicron geometries with great accuracy and reproducibility. Because all processing occurs in situ, i.e. in the same chamber, handling is minimized, thereby eliminating the possibility of introducing contaminants to the process and also significantly reducing processing time.

In another embodiment of the invention, an oxide layer, which may comprise a very thin oxide layer, may be grown on the newly cleaned silicon surface of the wafer in the same chamber after the native oxide and other contaminants are removed therefrom. The resulting grown oxide layer, even if very thin, will be uniform due to the absence of native oxides beneath the grown oxide layer.

DESCRIPTION OF THE INVENTION

Figure 1:
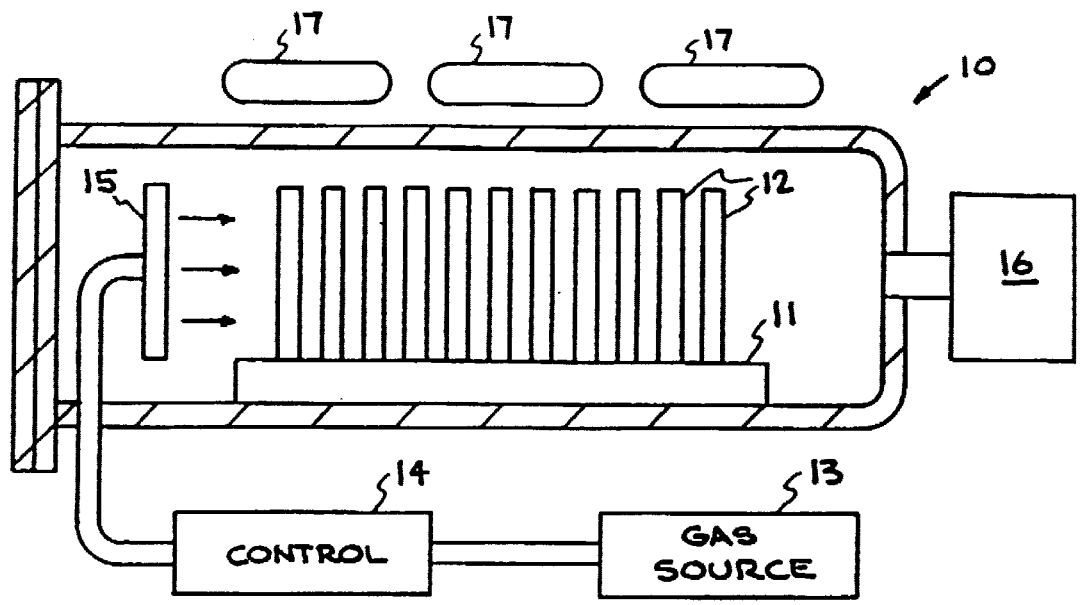
FIG. 1 is a schematic representation of one type of prior art LPCVD reaction chamber.
Figure 2:
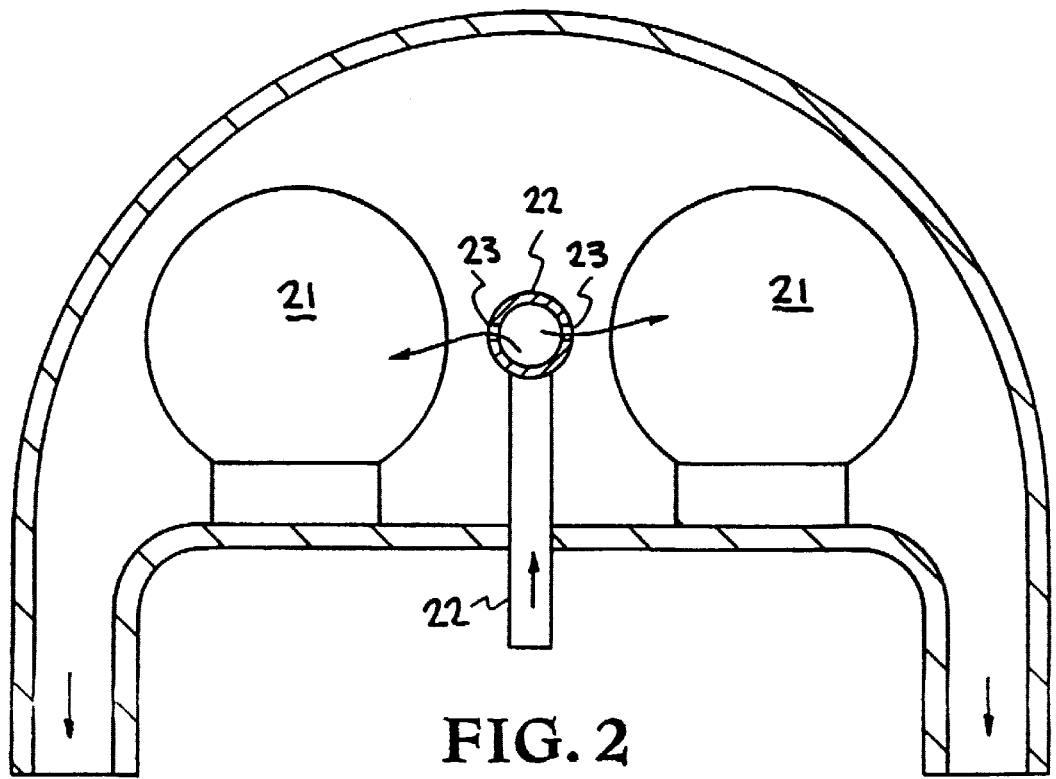
FIG. 2 is a schematic representation of another type of prior art LPCVD reaction chamber.

The present invention is a method for cleaning a silicon surface of a semiconductor wafer in a vacuum chamber within a first temperature range in the presence of hydrogen gas; then cooling the wafer down to a second temperature range; and then forming a layer of either polysilicon or oxide over the cleaned surface within this second temperature range without removing the cleaned wafer from the chamber.

For purpose of illustration, the present process is described with reference to FIG. 3 which illustrates a single wafer reactor 31 which includes a top wall 32, side walls 33, and a bottom wall 34 that define a chamber 30 into which a single semiconductor wafer 35, having a silicon surface, is loaded. Top wall 32 and bottom wall 34 are both substantially transparent to light, at least of infrared frequency, to allow external radiant heating of wafer 35 within chamber 30 as will be described below. Typically, top wall 32 and bottom wall 34 are formed of a high strength, transparent material such as quartz, which has the property of being transparent to light at infrared, visible, and UV frequencies while having relatively high strength to support a large pressure differential across the walls at a low rate of outgassing.

Wafer 35 is radiantly heated in chamber 30 by light of infrared frequency from high intensity lamps 38 and 39, located respectively above and beneath chamber 30, which respectively radiate heat to wafer 35 through top wall 32 and bottom wall 34.

Wafer 35 is mounted on a pedestal 36 in chamber 30 which pedestal is rotated by a motor 37 to provide a time averaged environment for the wafer that is cylindrically symmetric, i.e. to provide a more uniform exposure of the wafer surface to the radiant heat from lamps 38 and 39, and to the gases concurrently flowing through chamber 30.

Reactant gases flow from a gas input port 310 across wafer 35 to an exhaust port 311. A gas manifold (not shown) may be coupled to gas input port 310 to provide one gas or a mixture of two or more gases as required by the current semiconductor device fabrication process step. A laminar gas flow profile—input port 310 to exhaust port 311—is typically maintained within the chamber in such a manner to optimize processing uniformity. Other flow profiles may be provided if required.

A wafer to be processed in accordance with the present invention is placed in a reaction chamber of the type described above. The chamber is maintained at a pressure on the order of from about 5 to about 100 Torr, with a typically pressure of about 25 Torr during this initial cleaning step.

A flow of hydrogen gas is introduced into the chamber at a flow rate equivalent to a flow rate of from about 5 to about 50 liters per minute, typically about 20 liters per minute through an 11 liter chamber.

A variety of factors affect optimum hydrogen gas flow and chamber pressure. For example, lower chamber pressures allow contaminants to be removed more readily from the wafer surface; higher hydrogen gas flow rates provide enhanced contaminant stripping action. Although such combinations of high hydrogen flow rates and low chamber pressure may produce more effective native oxide removal, they require large and expensive pumping equipment for proper operation with standard equipment. Therefore, while the cleaning step may be carried out using a lower pressure and a higher hydrogen flow than the ranges specified, operation within the specified ranges will be found to provide the desired amount of removal of oxides and other contaminants while still operating the process in an economical manner.

The wafers are heated in the chamber to a temperature in the range of from about 800° to about 950° C. prior to commencing the flow of hydrogen into the chamber. To effect removal of oxides and other contaminants from the silicon surface, the wafer is maintained at this temperature for a period of from about 0.5 to about 4 minutes while continuing the hydrogen flow. Typically the wafer is maintained at this temperature for about 1 minute while continuing the hydrogen follow through the chamber. Temperatures and heating times within these ranges may be variously adjusted as needed.

After removal of oxides, such as native oxides, and other contaminants from the silicon surface on the wafer, and without removing the cleaned wafer from the reaction chamber, the wafer temperature is lowered to a range of from about 550° C. to about 750° C., preferably from about 600° C. to about 700° C., within which temperature range a layer of material, such as, for example, a polysilicon layer or an oxide layer, may be formed over the cleaned silicon surface.

This step of cooling the wafer, and the silicon surface thereon, down to the second temperature, is particularly critical as prolonged heating and cooling using previously practiced techniques, takes significant time during which time native oxides and other contaminants readily form on the newly cleaned silicon surface prior to formation of the subsequent layer thereon. Processing wafers one at a time using radiant heat to quickly heat and/or cool the wafer (by shutoff or reduction, of the radiant heat), eliminates this source of contamination because wafer temperatures are quickly raised to the initial cleaning temperature and then quickly lowered to the second (layer forming) temperature when processed in accordance with the invention.

Furthermore, the risk of undesirable oxide formation and other contamination of the newly cleaned silicon surface is further reduced by carrying out both the cleaning step and the subsequent formation of a layer of material over the newly cleaned surface in the same chamber. This is very important since even the presence of trace amounts of residual gases from other processes may contaminate the newly cleaned silicon surface if the wafer is moved to a different chamber to form a layer of material over the cleaned silicon surface.

For example, if the silicon surface on the wafer is cleaned in a first chamber and then the wafer is moved to a second chamber where processing had been previously carried out using nitrogen, if the silicon surface has not cooled sufficiently during the transfer, i.e., below 800° C., traces of undesirable nitrides may be formed on the cleaned silicon surfaces even if both chambers are maintained under vacuum and the wafer is moved from one chamber to the other through a vacuum load lock mechanism, as is sometimes practiced in the prior art.

After the wafer has cooled down to within the broad range of from about 550° C. to about 750° C., or the preferred range of from about 600° C. to about 700° C., and while maintaining the reactor chamber within a pressure range of from about 25 Torr to about 150 Torr, preferably from about 80 Torr to about 100 Torr, a polysilicon layer may be deposited over the cleaned silicon surface by flowing into the reaction chamber and over the cleaned silicon surface on the wafer a gaseous mixture of a silicon-containing gas such as, for example, silane or disilane gas; and a hydrogen carrier gas.

The ratio of silicon-containing gas to hydrogen carrier gas should range from about 1:50 to about 1:10. Thus, for example, using an 11 liter reaction chamber, the flow of hydrogen carrier gas may range from about 5000 standard cubic centimeters per minute (sccm) to about 10,000 sccm; while the flow of silicon-containing gas, when silane is used, may vary from about 100 sccm to about 100 sccm, or from about 10 sccm to about 100 sccm when disilane gas is used as the source of silicon.

In an alternate embodiment, where it is desired to grow an oxide layer over the cleaned silicon surface, the wafer is again cooled down to within the broad range of from about 550° C. to about 750° C., or the preferred range of from about 600° C. to about 700° C., the flow of hydrogen is shut off, and an inert gas such as argon or helium is flowed through the chamber for a period of at least about 1 minute to purge hydrogen.

An oxygen layer, which may be a very thin layer, e.g., as thin as 20 Angstroms if desired, may then be grown on the silicon surface by flowing oxygen into the reaction chamber and over the silicon surface, while maintaining the pressure within the reaction chamber within a range of from about 5 to about 100 Torr, typically about 25 Torr. The oxygen gas may be flowed solely into the reaction chamber, but preferably the oxygen gas is mixed with an inert or non-reactive carrier gas, such as helium, argon, or nitrogen, in an amount ranging from about 0.1 to about 10 volume % oxygen, preferably from about 0.5 to about 5 volume % oxygen, and typically about 1 volume %, in the mixture. The amount of time the oxygen is allowed to flow will depend on the desired thickness of the oxide layer, as is well known to those skilled in the art. The flow rate of the gaseous mixture of oxygen and carrier gas into the reaction chamber is equivalent to a flow rate ranging from about 3000 to about 10,000 sccm into an 11 liter chamber.

a polysilicon layer may then be deposited over this new grown oxide layer, again without removing the wafer from the reaction chamber, by discontinuing the flow of oxygen into the chamber; purging the chamber with an inert gas such as argon or helium, or a nonreactive gas such as nitrogen for a period of at least about 1 minute; and then flowing into the chamber a mixture of hydrogen and a silicon-containing gas such as previously described with respect to the deposition of a polysilicon layer directly over the cleaned silicon surface.

Thus, the invention provides an improved process for the formation of either a polysilicon or oxide layer on a silicon surface of a semiconductor wafer wherein the silicon surface is cleaned at a first temperature using hydrogen gas and an optional plasma using radiant heat to quickly heat the wafer surface to the desired cleaning temperature, and then, without removing the wafer from the vacuum chamber, the silicon surface temperature is quickly reduced down to a second and lower temperature at which temperature a layer is formed over the cleaned silicon surface in the same vacuum chamber either by growing an oxide layer or by depositing a polysilicon layer.

Figure 3:
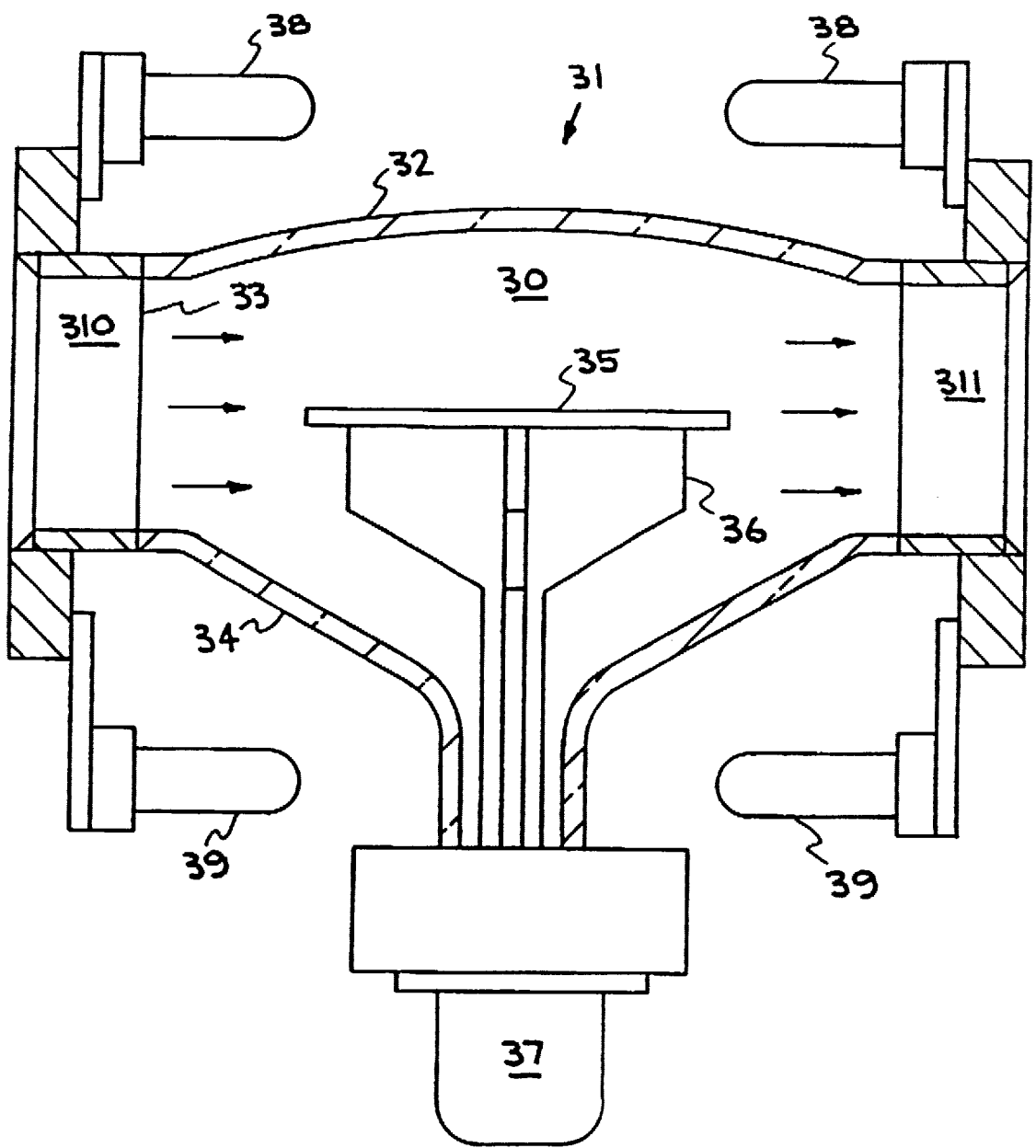
FIG. 3 is a schematic representation of a reaction chamber which may be used in the practice of the claimed invention.

Although the invention has been described herein with reference to the chamber illustrated in FIG. 3, and with reference to particular temperatures, gas pressures, flow rates, and other parameters, one skilled in the art will readily appreciate that other chambers, temperature ranges, flow rates, reactants, and pressures may be substituted without departing from the spirit of the invention. Accordingly, the invention should only be limited by the claims.

What is claimed is:

1. A method for processing a semiconductor wafer having a silicon surface thereon to form a layer over said silicon surface which consists essentially of:

a) placing said wafer in a vacuum chamber having at least one single-wall portion transparent to light of at least infrared frequency to allow external radiant heating of said wafer;

b) radiantly heating said silicon surface to a first temperature of from about 800° C. to about 950° C. by infra-red energy passing through said at least one single-wall portion of said vacuum chamber;

c) heating said silicon surface to said first temperature, commencing a flow of between 5–50 liters/minute of hydrogen gas through said vacuum chamber for a period of from about 0.5 to about 4 minutes while maintaining said wafer at said first temperature to thereby clean said silicon surface on said wafer by removing oxide and any other contaminants from said surface;

d) thereafter, without removing said wafer from said vacuum chamber, cooling said silicon surface down to a second temperature low enough to permit formation of a layer over said cleaned silicon surface; and e) then forming a layer on said cleaned silicon surface of said semiconductor wafer in said same vacuum chamber while continuing said heating of said silicon surface to maintain said surface at said second temperature.

2. A method for processing a semiconductor wafer having a silicon surface thereon to form a layer over said silicon surface which consists essentially of:

a) placing said wafer in a vacuum chamber having at least one single-wall portion transparent to light of at least infrared frequency to allow external radiant heating of said wafer;

b) radiantly heating said silicon surface to a first temperature of from about 800° C. to about 950° C. by infra-red energy passing through said at least one single-wall portion of said vacuum chamber to clean said silicon surface on said wafer by removing oxide and any other contaminants from said surface when hydrogen gas is flowed through said chamber;

c) heating said silicon surface to said first temperature, commencing a flow of between 5–50 liters/minute of hydrogen gas through said vacuum chamber for a period of from about 0.5 to about 4 minutes while maintaining a total pressure of between 5–100 torr in said chamber and while maintaining said wafer at said first temperature to thereby clean said silicon surface on said wafer by removing oxide and any other contaminants from said surface;

d) thereafter, without removing said wafer from said vacuum chamber, cooling said silicon surface down to a second temperature to permit formation of a layer over said cleaned silicon surface; and e) then forming a layer on said cleaned silicon surface of said semiconductor wafer in said vacuum chamber while continuing said heating of said silicon surface to maintain said surface at said second temperature.

3. The method of claim 1 wherein said step of forming a layer on said cleaned silicon surface in said vacuum chamber further comprises forming on said cleaned silicon surface a layer selected from the group consisting of polysilicon and oxide.

4. The method of claim 2 wherein said step of forming a layer on said cleaned silicon surface in said vacuum chamber further comprises forming on said cleaned silicon surface a layer selected from the group consisting of polysilicon and oxide.

5. A method for processing a semiconductor substrate having a silicon surface thereon to form a layer over said silicon surface which consists essentially of:

a) placing said substrate in a vacuum chamber having at least one single-wall portion transparent to light of at least infrared frequency to allow external radiant heating of said wafer;

b) radiantly heating said silicon surface to a first temperature of from about 800° C. to about 950° C. by infra-red energy passing through said at least one single-wall portion of said vacuum chamber to clean said silicon surface on said substrate to remove oxide and any other contaminants from said surface when hydrogen gas is flowed through said chamber;

c) after heating said silicon surface to said first temperature, commencing the flow of hydrogen gas through said vacuum chamber for a period of from about 0.5 to about 4 minutes while maintaining said chamber at a pressure within a range of from about 5 Torr to about 100 Torr and while maintaining said substrate at said first temperature to thereby clean said silicon surface on said substrate;

d) thereafter, without removing said substrate from said vacuum chamber, cooling said silicon surface down to a second temperature low enough to permit formation of a layer over said cleaned silicon surface; and e) then forming a layer on said cleaned silicon surface of said semiconductor substrate in said same vacuum chamber while continuing said heating of said silicon surface to maintain said surface at said second temperature.

6. The process of claim 1 wherein said step of flowing said hydrogen through said vacuum chamber while maintaining said wafer at said first temperature is carried out for a period of time ranging from about 0.5 minutes to about 1 minute.

7. The process of claim 2 wherein said step of flowing said hydrogen through said vacuum chamber while maintaining said wafer at said first temperature is carried out for a period of time ranging from about 0.5 minutes to about 1 minute.

8. The process of claim 5 wherein said step of flowing said hydrogen through said vacuum chamber while maintaining said wafer at said first temperature is carried out for a period of time ranging from about 0.5 minutes to about 1 minute.

9. The method of claim 5 wherein said hydrogen is flowed through said vacuum chamber at a flow rate equivalent to a flow rate of from about 5,000 sccm to about 50,000 sccm through an 11 liter chamber.

10. The method of claim 5 wherein said step of forming a layer on said cleaned silicon surface in said vacuum chamber further comprises forming on said cleaned silicon surface a layer selected from the group consisting of polysilicon and oxide.

11. The method of claim 10 wherein said step of forming a layer on said cleaned silicon surface further comprises depositing a layer of polysilicon over said cleaned silicon surface.

12. The method of claim 11 wherein said step of depositing said layer of polysilicon further comprises flowing a silicon-containing gas into said vacuum chamber while maintaining said chamber at said second temperature.

13. The method of claim 12 wherein step of flowing said silicon-containing gas into said vacuum chamber further comprises flowing a mixture of hydrogen and said silicon-containing gas into said vacuum chamber at a rate equivalent to the flow of from 5,000 sccm to about 10,000 sccm into an 11 liter vacuum chamber in a silicon-containing gas to hydrogen volume % ratio of from about 1:50 to about 1:10.

14. The method of claim 13 wherein said step of depositing a layer of polysilicon further comprises maintaining a pressure of from about 25 Torr to about 150 Torr in said vacuum chamber during said deposition.

15. The method of claim 12 wherein said silicon-containing gas is selected fro the group consisting of silane and disilane.

16. The method of claim 5 wherein said step of forming a layer on said cleaned silicon surface further comprises growing a layer of oxide over said cleaned silicon surface.

17. The method of claim 10 wherein said step of growing said layer of oxide further comprises first flowing into said chamber a non-reactive gas to purge hydrogen from said chamber; and then flowing into said vacuum chamber a gaseous mixture comprising a non-reactive gas containing at least about 0.5 volume % oxygen, while continuing to radiantly heat said silicon surface to maintain said surface at said second temperature.

18. The method of claim 17 wherein step of flowing said gaseous mixture containing oxygen into said vacuum chamber further comprises flowing said gaseous mixture into said vacuum chamber at a rate equivalent to the flow of from 3,000 sccm to about 10,000 sccm into an 11 liter vacuum chamber.

19. The method of claim 18 wherein said step of growing said layer of oxide further comprises maintaining a pressure of from about 5 Torr to about 100 Torr in said vacuum chamber during said oxide growth.

* * * * *